United States Patent [19]
Peeters

[11] Patent Number: 6,151,690
[45] Date of Patent: Nov. 21, 2000

[54] INTERLEAVING AND DE-INTERLEAVING METHOD FOR DIGITAL DATA, INTERLEAVING AND DE-INTERLEAVING DEVICES, AND COMMUNICATION SYSTEM

[75] Inventor: Miguel Peeters, Brussels, Belgium

[73] Assignee: Alcatel, Paris, France

[21] Appl. No.: 09/010,814

[22] Filed: Jan. 23, 1998

[30] Foreign Application Priority Data

Jan. 31, 1997 [EP] European Pat. Off. ............. 97400231

[51] Int. Cl.$^7$ ...................................................... G06F 11/00
[52] U.S. Cl. ........................................... 714/701; 711/157
[58] Field of Search ............................. 714/701; 711/157

[56] References Cited

U.S. PATENT DOCUMENTS

| | | | |
|---|---|---|---|
| 4,433,415 | 2/1984 | Kojima | 371/37 |
| 4,559,625 | 12/1985 | Berlekamp et al. | 371/2 |
| 5,537,420 | 7/1996 | Huang | 371/2.1 |
| 6,035,427 | 3/2000 | Kweon | 714/702 |
| 6,055,277 | 4/2000 | Stephens et al. | 375/285 |

FOREIGN PATENT DOCUMENTS

| | | |
|---|---|---|
| 0048151 | 3/1982 | European Pat. Off. . |
| 0681373 | 11/1995 | European Pat. Off. . |
| 2592258 | 12/1985 | France . |

*Primary Examiner*—Phung M. Chung

[57] ABSTRACT

A triangular interleaver (INTERLEAVER) contains a triangular shaped matrix (MAT) of memory cells, each row of which constitutes a first-in-first-out queue. To increase or decrease the interleave depth of the interleaver (INTERLEAVER), the number of interleaved data bytes read from each row of the matrix (MAT) is positively or negatively linearly related to the ordinate number (0, 1, 2, 3, 4) of this row. In this way, impulse noise immunity of transmission of the outgoing interleaved data stream (OID) over a transmission line (TL) is kept substantially independent from transmit rate changes.

18 Claims, 9 Drawing Sheets

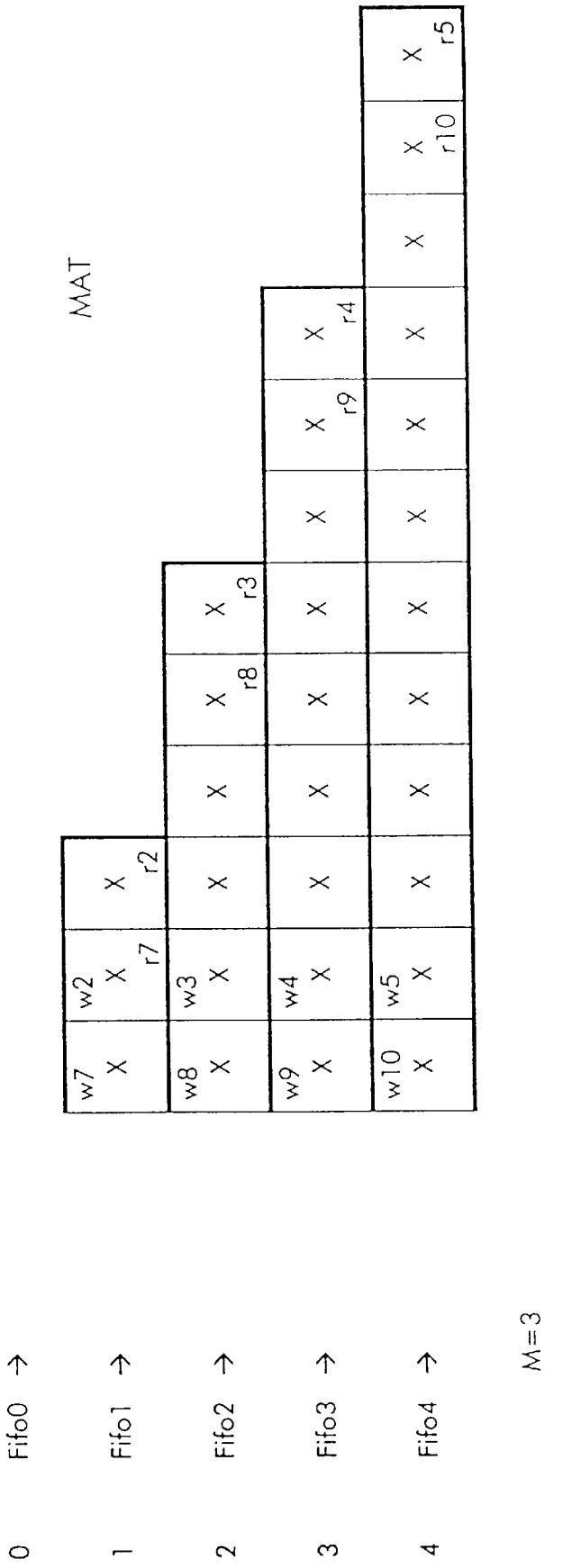

INTERLEAVING AND DE-INTERLEAVING METHOD FOR DIGITAL DATA, INTERLEAVING AND DE-INTERLEAVING DEVICES, AND COMMUNICATION SYSTEM

BACKGROUND OF THE INVENTION

1. Technical Field

The present invention relates to a method for interleaving an incoming data stream, a method for de-interleaving an incoming interleaved data stream, interleaving and de-interleaving device, and a communication system.

2. Discussion of Related Art

Such a method for interleaving and de-interleaving, such interleaving and de-interleaving devices and such a communication system are already known in the art, e.g., from the United States patent U.S. Pat. No. 4,559,625 entitled 'Interleavers for digital communication' from the inventors Elwyn R. Berlekamp and Po Tong.

In the communication system described in U.S. Pat. No. 4,559,625, an encoding apparatus develops redundant information in a mathematically prescribed manner and adds this redundant information to the data bytes of codewords. The data bytes of several independently encoded codewords then are re-sequenced by an interleaver. In this way, transmission of the codewords over a transmission link becomes more immune for burst noise of long duration. By re-sequencing the data symbols, burst errors are more evenly distributed over independently encoded codewords. As a consequence, error correction through decoding the transmitted codewords is enhanced. Summarizing, the interleaver alters the sequence of data bytes of several codewords to more uniformly distribute the effect of signal degradation or noise on the transmission line over different codewords. In the interleaver, data bytes thereto are entered in memory cells and later on are read out of these memory cells in an order different from the order wherein they entered the memory. The interleaving delay of a data byte is the time interval elapsed between entering and leaving the memory, and usually is expressed as the amount of bytes read out of the memory between the entering and leaving time of the considered data byte. Another important parameter, equal to the number of data bytes in the outgoing interleaved data stream between two data bytes of one and the same codeword, is called the interleaving depth. The interleaving depth is a quantitative indicator of the enhancement of immunity of the transmission for burst noise or the like. In the interleaver described in U.S. Pat. No. 4,559,625, the memory cells wherein data bytes are stored constitute a triangular shaped matrix, i.e. the upper right triangle in the rectangular matrix drawn in FIG. 4a of U.S. Pat. No. 4,559,625. When each row of the triangular shaped matrix is implemented by a first-in-first-out queue, and if incoming data bytes are stored in tail memory cells of the rows while outgoing data bytes are read out of head memory cells of the rows, the interleaving delay of any byte varies linearly related to the ordinal position of the data byte. This is expressed in Col. 2, ln. 34–41 of the cited U.S. patent. In other words, the interleaving delay of a data byte and the ordinate of the row wherein the data byte is stored are linearly interrelated in the known triangular interleaver. The interleaving depth, which defines the noise immunity of the transmission, is constant and determined by the delay increment per row of the matrix. This delay increment is the difference in length between two successive rows of the matrix, expressed as an amount of memory cells.

In a communication system with variable transmit rates, the effect of interleaving on noise immunity of the transmission depends upon the actual transmit rate. If for instance the transmit rate in a first situation is half the transmit rate in a second situation, burst errors of equal duration will damage in the second situation twice the amount of data bytes damaged in the first situation. If the interleaving depth in situation 2 equals that of situation 1, and the error correction codes added to the codewords are the same in both situations, noise immunity in situation 2 expressed as the maximum duration of a burst error which can be rectified, is only half the noise immunity of situation 1. Communication system designers usually have to realize a certain minimum level of erasure correction to accord with standard specifications. The interleaving depth and error correction code length are chosen by the designer to meet this minimum erasure correction level in a worst case scenario. In a communication system with variable transmit rates, this worst case scenario is the situation wherein data are transmitted at the highest allowable transmit rate. If the above described known interleaver is used and data are transmitted at a lower transmit rate, the noise immunity will be better than required, but this is paid by an interleaving delay which is longer than necessary for an exact adjustment of the noise immunity to the minimum required level at this lower transmit rate.

SUMMARY OF INVENTION

In other communication systems, it may be wished to have an adaptable noise immunity so that the capacity for restoring the effect of burst noise errors on the transmission line may be modified as a function of the quality of the line, the noise pollution, service dependent or user dependent requirements, and so on.

It is therefore an object of the present invention to provide a method for interleaving and de-interleaving, interleaving and de-interleaving devices and a communication system of the known type, but wherein noise immunity can be modified or an be made independent from the transmit rate over the transmission line.

According to a first aspect of the invention, a method for interleaving incoming data bytes of an incoming data stream to generate an outgoing interleaved data stream of outgoing interleaved data bytes, wherein said incoming data bytes are written in tail memory cells of rows of a triangular shaped matrix of memory cells, each row of memory cells in said matrix representing a first-in-first-out queue, and wherein said outgoing interleaved data bytes are read from head memory cells of said rows thereby realizing said outgoing interleaved data stream is characterized in that from each row an amount of said outgoing interleaved data bytes is read which is linearly related to an ordinate number of said row in said triangular shaped matrix.

According to a second aspect of the invention, a method for de-interleaving incoming interleaved data bytes of an incoming interleaved data stream to thereby generate an outgoing data stream of outgoing data bytes, wherein said incoming interleaved data bytes are written tail memory cells of rows of a triangular shaped matrix of memory cells, each row of memory cells in said matrix representing a first-in-first-out queue, and wherein said outgoing data bytes are read from head memory cells of said rows thereby realizing said outgoing data stream is characterized in that in each row of said triangular shaped matrix an amount of said incoming interleaved data bytes is written which is linearly related to an ordinate number of said row in said triangular shaped matrix.

According to a third aspect of the invention, an interleaving device used to resequence incoming data bytes of an incoming data stream to thereby generate an outgoing interleaved data stream of outgoing interleaved data bytes, comprises a memory means including a plurality of first-in-first-out queues adapted to represent respective rows of a triangular shaped matrix of memory cells, writing means with an output coupled to an input of said memory means, said writing means being adapted to represent respective rows of a triangular shaped matrix of memory cells, writing means with an output coupled to an input of said memory means, said writing means being adapted to write each one of said incoming data bytes in a tail memory cell of one of the said rows identified by a write address, reading means with an input coupled to an output of said memory means, said reading means being adapted to read each one of said outgoing interleaved data bytes from a head memory cell of one of said rows identified by a read address, and address generating means, a first output of which is coupled to an address input of said writing means and a second output of which is coupled to an address input of said reading means, said address generating means being adapted to generate said write address and said read address, is characterized in that said address generating means is further adapted to generate for each row an amount of read addresses which is linearly related to an ordinate number of said row in said triangular shaped matrix.

According to a fourth aspect of the invention, a de-interleaving device used to resequence incoming interleaved data bytes of an incoming interleaved data stream to thereby generate an outgoing data stream of outgoing data bytes, comprising memory means including a plurality of first-in-first-out queues adapted to represent respective rows of a triangular shaped matrix of memory cells, writing means with an output coupled to an input of said memory means, said writing means being adapted to write each one of said incoming interleaved data bytes in a tail memory cell of one of said rows identified by a write address, reading means with an input coupled to an output of said memory means, said reading means being adapted to reach each one of said outgoing data bytes from a head memory cell of one of said rows identified by a read address, and address generating means, a first output of which is coupled to an address input of said writing means and a second output of which is coupled to an address input of said reading means, said address generating means being adapted to generate said write address and said read address, is characterized in that said address generating means is further adapted to generate for each row of said triangular shaped matrix an amount of write addresses which is linearly related to an ordinate number of said row in said triangular shaped matrix.

According to a fifth aspect of the invention, a communication system comprising a transmitter coupled via a transmission line to a receiver comprising the cascade connection of a data source provided to generate a data stream, encoding means provided to extend words of said data stream with redundant information to thereby generate codewords of an incoming data stream, interleaving means provided to resequence incoming data bytes of said incoming data stream to thereby generate an outgoing interleaved data stream of outgoing interleaved data bytes, and modulating means provided to modulate said outgoing interleaved data stream on at least one data carrier to be transmitted over said transmission line; said interleaving means comprising first memory means including a plurality of first-in-first-out queue adapted to represent respective rows of a first triangular shaped matrix of memory cells, first writing means with an output coupled to an input of said first memory means, said first writing means being adapted to write each one of said incoming data bytes in a tail memory cell of one of said rows identified by a write address, first reading means with an input coupled to an output of said first memory means, said reading means being adapted to reach each one of said outgoing interleaved data bytes from a head memory cell of one of said rows identified by a read address, and first address generating means, a first output of which is coupled to an address input of said first writing means and a second output of which is coupled to an address input of said first reading means, said first address generating means being adapted to generate said write address and said read address, and said receiver comprising the cascade connection of demodulating means provided to demodulate incoming interleaved data bytes from said at least one carrier to thereby produce an incoming interleaved data stream, de-interleaving means provided to resequence said incoming interleaved data bytes in said incoming interleaved data stream to thereby generate an outgoing data stream of outgoing data bytes grouped in codewords, decoding means provided to detect and correct errors in said codewords by interpretation of redundant information therein to thereby produce a data stream or words, and a data sink provided to receive said data stream from said decoding means, said de-interleaving means comprising second memory means including a plurality of first-in-first-out queues adapted to represent respective rows of a second triangular shaped matrix of memory cells, second writing means with an output coupled to an input of said second memory means, said second writing means being adapted to write each one of said incoming interleaved data bytes in a tail memory cell of one of said rows identified by a write address, second reading means with an input coupled to an output of said second memory means, said reading means being adapted to read each one of said outgoing data bytes from a head memory cell of one of said rows identified by a read address, and second address generating means, a first output of which is coupled to an address input of said second writing means and a second output of which is coupled to an address input of said second reading means, said second address generating means being adapted to generate said write address and said read address, is characterized in that said first address generating means is further adapted to generate for each row an amount of read addresses which is linearly related to an ordinate number of said row in said first triangular shaped matrix, and further in that said second address generating means further is adapted to generate for each row of said second triangular shaped matrix an amount of write addresses which is linearly related to an ordinate number of said row in said second triangular shaped matrix.

An obvious way to realize the above described object is to adapt the shape of the triangular matrix by emptying the interleaving memory completely and re-formatting the triangular shaped matrix so that for instance the delay increment per row of the matrix increases. By adapting for instance the delay increment per row each time the transmit rate changes, the interleaving depth changes accordingly as a result of which the noise immunity remains substantially independent from the transmit rate. This obvious way however is not very efficient because it involves a very long transition state, wherein transmission has to be interrupted.

According to the invention, the interleave depth is modified by adapting the shape of the triangular array in a dynamic way, i.e. without emptying the whole interleaving memory. Indeed, if the number of interleaved data bytes read from a row of the matrix is linearly related to the ordinate of this row, the delay increment per row of the matrix is decreased or increased. If for instance 1 data byte is read from row 1, two data bytes are read from row 2, . . . , l–1 data bytes are read from row l–1, the difference in length between two successive rows of the matrix (which is the delay increment per row) is decreased by 1.

It is to be noticed that the term 'comprising', used in the claims, should not be interpreted as being limitative to the means listed thereafter. Thus, the scope of the expression 'a device comprising means A and B' should not be limited to devices consisting only of components A and B. It means that with respect to the present invention, the only relevant components of the device are A and B.

Similarly, it is to be noted that the term 'coupled', also used in the claims should not be interpreted as being limitative to direct connections only. Thus, the scope of the expression 'a means A coupled to a means B' should not be limited to devices or systems wherein an output of means A is directly connected to an input of means B. It just means that there exists a path between an output of A and an input of B which may be a path including other devices or means.

Another remark is that a variant of the present system and method is one wherein the role of columns and rows of the interleaving or de-interleaving matrix is inverted. Applicability of the present invention clearly is not restricted to those implementations wherein rows of the matrices are drawn horizontally and columns are drawn vertically. For evident reasons, one obtains the same technical result when the terms 'column' and 'row' are interchanged through the whole application. The scope of protection defined by the claim hence should also not be limited to embodiments of the present invention wherein 'row' is synonymous for a horizontal structure and 'column' is per se associated with a vertical structure.

Furthermore, it should be stressed that the ordinate numbers of rows or columns in the interleaving and/or de-interleaving matrices may be increasing from bottom to top, from top to bottom, from left or right or from right to left according to the designers preferences. As a consequence, the triangular shaped matrix may have a top pointing in upward, downward, left or right directions. For the designer it is only important to have an addressing conform to his/her choice of ordinate numbers. The scope of the claims should not be interpreted as being limitative for this choice.

A further feature of the present method for interleaving is defined in that in each row of the triangular shaped matrix an equal amount of the incoming data bytes is written.

In this way, a less complex interleaver can be realised since the amount of outgoing interleaved data bytes read from a row of the matrix then becomes independent from the amount of data bytes written in this row.

An additional characteristic feature of the present invention is defined in that reading the outgoing interleaved data bytes is performed this way when the transmit rate for transmission of said outgoing interleaved data stream over a transmission line increases or decreases.

In this way, the noise immunity is kept constant in a system with variable transmit rates.

It is remarked here that the delay increment per row of the interleaving triangular matrix may also be adapted according to the present invention in systems with constant transmit rates to increase or decrease the error protection therein. As already suggested above, other criteria than the increase or decrease of the transmit rate have to be used in such systems to decide when bytes are read out of the matrix according to the present invention. If in such a system the delay increment per row increases, the interleaving depth increases accordingly as a consequence of which the error protection has improved. Similarly, the error protection becomes worse when the delay increment per row is decreased.

Yet another feature of the present method is defined in that when said transmit rate remains substantially constant, an equal amount of said incoming data bytes is written in each row of said triangular shaped matrix while an equal amount of said outgoing interleaved data bytes is read from each row.

Thus, when the transmit rate on the transmission line remains substantially constant, data bytes are written in and read out of the triangular shaped matrix in the known manner.

Another feature of the present method is defined in that when said transmit rate decreases, said amount of said outgoing interleaved data bytes read is positively related to said ordinate number.

Indeed, if the rows of the triangular matrix are numbered so that the ordinate numbers grow with the length of the row, the delay increment per row decreases when the number of read interleaved data bytes per row is positively related to the ordinate number of the row. A decreased delay increment per row results in a decreased interleaving depth and hence in a lower burst noise immunity. The decrease of the transmit rate on the other hand has an increasing effect on the burst noise immunity. Both effects may compensate so that the noise immunity remains substantially independent from the transmit rate.

Yet another feature of the present method is defined in that when the transmit rate increases, said amount of said outgoing interleaved data bytes read is negatively related to said ordinate number.

Indeed, if the rows of the triangular shaped matrix are again numbered so that the ordinate numbers grow with the length of the rows, it can be deduced in a similar way as above that the noise immunity remains substantially insensitive for a transmit rate increase if the amount of interleaved data bytes read from the rows of the matrix is negatively related to the ordinate numbers of these rows.

To decrease the interleave depth, outgoing data bytes may be read, in a first particular implementation of the present method in that when said transmit rate decreases, successive outgoing interleaved data bytes are from from row I row I–1 and row I row I–2, row I–2 and row I, and so on until outgoing interleaved data bytes are read from row 1 to row I1, I being the number of rows in said triangular shaped matrix.

Indeed, the number of data bytes read from each row in the matrix is equal to the ordinate number of the row. As will be explained later, this implementation requires the presence of a buffer in both the interleaver and de-interleaver.

In a second particular implementation of the present method for interleaving, outgoing data bytes may be read to decrease the interleaving depth in that I–1 dummy bytes are generated and inserted in said outgoing interleaved data stream before a first outgoing interleaved data byte is read out of row I, I–2 dummy bytes are generated and inserted in said outgoing interleaved data stream before a first outgoing interleaved data byte is read out of row I–1, I–3 dummy bytes are generated and inserted in said outgoing interleaved data stream before a first outgoing interleaved data byte is read out of row I–2, and so on.

In this way, the number of data bytes read from each row in the matrix is again equal to the ordinate number of the row. The dummy bytes are inserted at the interleaver but no de-interleaved in the de-interleaver. An advantage of this implementation is that there is no buffer needed at the de-interleaver but the size of the interleavers buffer, as will be shown later, has doubled. Another advantage thereof is that the interleaver and the de-interleaver can be obtained than for the first particular implementation, and the noise immunity stays constant while adapting the interleave depth.

To increase the delay increment per row, a first particular implementation is defined in in that when said transmit rate increases, successive outgoing interleave data bytes are read from:
  row 0
  row 0 and row;
  row 0 row 1 and row 2
and so on until outgoing interleaved data bytes are read from row 0 to row I–2, I being the number of rows in said triangular shaped matrix.

A second implementation is defined in that
  I–1 dummy bytes are generated and inserted in said outgoing interleaved data stream after a first outgoing interleaved data byte is read out of row 0;
  I–2 dummy bytes are generated and inserted in said outgoing interleaved data stream after a first outgoing interleaved data byte is read out of row 1;
  I–3 dummy bytes are generated and inserted in said outgoing interleaved data stream after a first outgoing interleaved data byte is read out of row 2,
and so on.

Similar to the implementations for decreasing the delay increment, defined above, the second implementation may be realized in a less complex way and requires no buffer in the interleaver or de-interleaver. The first implementation requires the presence of a buffer in the interleaver but realizes a better throughput since no bandwidth is used to transport dummy bytes.

BRIEF DESCRIPTION OF THE DRAWING

The above and other objects and features of the invention will become more apparent and the invention itself will be best understood by referring to the following description of an embodiment taken in conjunction with the accompanying drawings wherein:

FIG. 4A is a drawing illustrating the filling of the interleaving memory with data bytes during a stead state wherein the delay increment M is 3;

FIG. 5A is a drawing illustrating the filling of the interleaving memory with data bytes during a transition state wherein the delay increment M is reduced from 3 to 2;

FIG. 6B is a drawing illustrating the filling of the de-interleaving memory with data bytes during this transition state wherein the delay increment M is increased from 3 to 4.

DETAILED DESCRIPTION OF PREFERRED EMBODIMENTS

Figure 1:
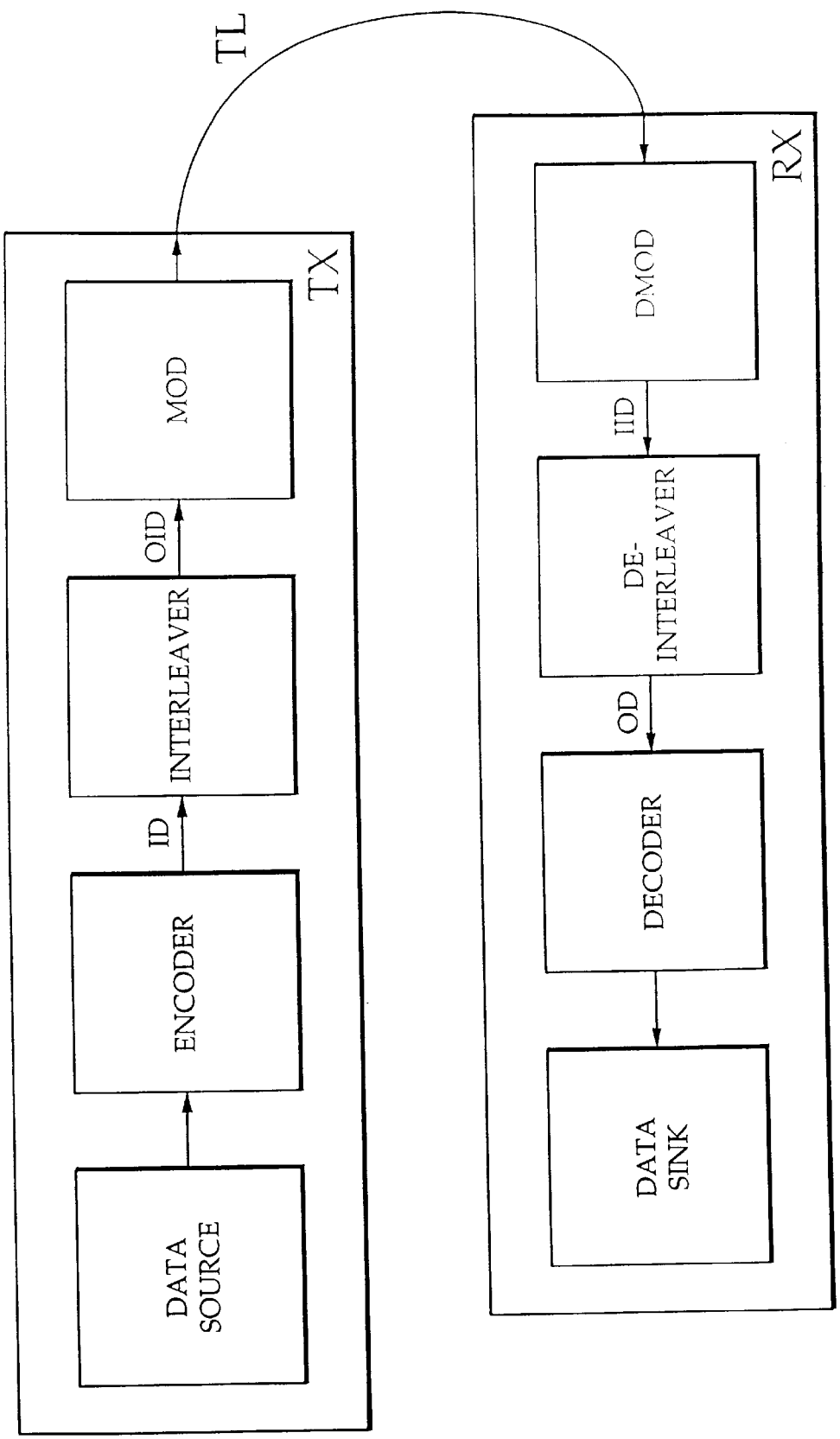
FIG. 1 is a block scheme of an embodiment of the communication system according to the present invention.

The communication system drawn in FIG. 1 consists of a transmitter TX, a receiver RX and a transmission line TL. The transmitter TX includes a data source DATA SOURCE, an encoder ENCODER, an interleaving device INTERLEAVER and a modulator MOD. The receiver RX includes a demodulator DMOD, a de-interleaving device DE-INTERLEAVER, a decoder DECODER and a data sink DATA SINK.

An output of the transmitter TX is coupled to an input of the receiver RX via the transmission line TL. Inside the transmitter TX, the data source DATA SOURCE, the encoder ENCODER, the interleaver INTERLEAVER and the modulator MOD are cascade connected. An output of the modulator MOD is coupled to the transmission line TL via the transmitter output. The other end of the transmission line TL is coupled to an input of the demodulator DMOD via the receiver input. Inside the receiver RX, the demodulator DMOD, the de-interleaver DE-INTERLEAVER, the decoder DECODER and the data sink DATA SINK are cascade connected.

The data source DATA SOURCE produces a data stream which may comprise user data bytes and/or overhead data bytes. A fixed amount of these bytes constitutes a single word and each one of these words is encoded by the encoder ENCODER. This implies that the encoder ENCODER extends each of the words according to predefined mathematic schemes by adding redundant bytes thereto. These redundant bytes and the mathematical schemes will enable the receiver RX to detect and probably to correct errors in transmitted words. The extended words generated by the encoder ENCODER are called codewords and constitute an incoming data stream ID for the interleaver INTERLEAVER. By re-sequencing the data bytes of different codewords of the incoming data stream OID which is better protected for burst noise on the transmission line TL than the incoming data stream ID. The modulator MOD finally modulates data symbols, i.e. combinations of data bits of the data stream OID which represent one point in the constellation scheme of the modulation method, on one or more carriers to be transmitted over the transmission line TL.

At the receiver RX, the demodulator DMOD demodulates the data symbols from the carrier(s) and generates from the demodulated data symbols a stream of data bytes named the incoming interleaved data stream IID. The bytes of the incoming interleaved data stream IID are re-sequenced in the de-interleaver DE-INTERLEAVER so that the effect of the interleaver INTERLEAVER on the order of bytes is compensated for and the generated outgoing data stream OD again contains the original sequence of data bytes. In the decoder DECODER, errors due to transmission are detected and corrected by using the already mentioned mathematical schemes and the information of the redundantly added bytes. The so determined data stream than is applied to the data sink DATA SINK, which may be any kind of terminal, interface or the like.

In the communication system of FIG. 1, the interleaver INTERLEAVER and de-interleaver DE-INTERLEAVER are designed to provide to the transmitted data stream a transmit rate independent impulse noise immunity. The INTERLEAVER and DE-INTERLEAVER structure which realized this object, is drawn in FIG. 2 and FIG. 3 respectively, and is described in detail in the following paragraphs.

Figure 2:
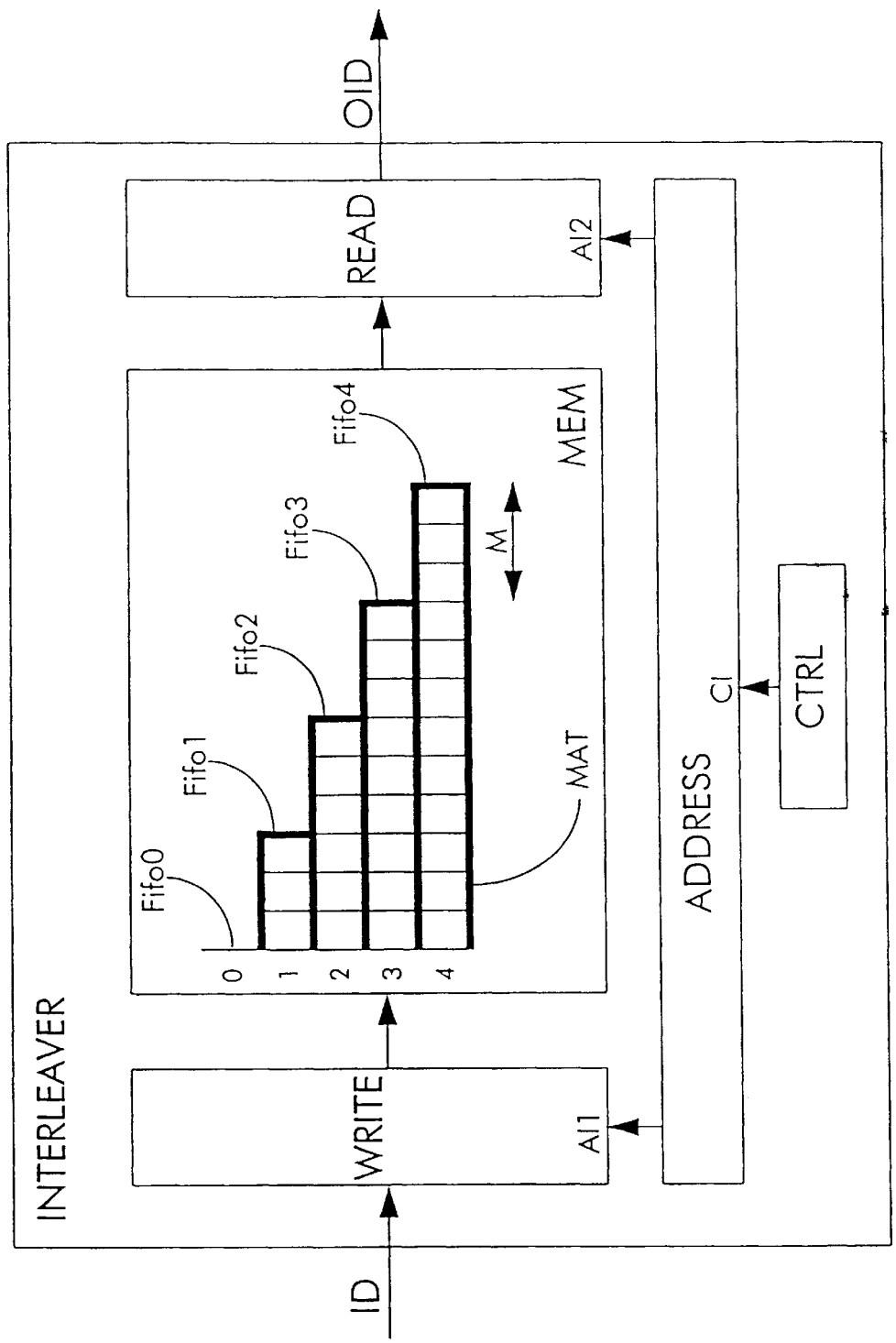
FIG. 2 is a block scheme of an embodiment of the interleaving device INTERLEAVER according to the present invention.

The interleaver INTERLEAVER of FIG. 2 includes writing means WRITE, reading means READ, a memory MEM, an address generator ADDRESS and a controller CTRL. The memory MEM is equipped with a triangular shaped matrix MAT of memory cells wherein each row is constituted by a first-in-first-out queue of memory cells. In FIG. 2, five rows of the matrix MAT with respective ordinates 0, 1, 2, 3 and 4 are constituted by the queues Fifo0, Fifo1, Fifo2, Fifo3, and Fifo4 which have an incrementally growing length, the increment per row being equal to M=3.

The writing means WRITE, the memory MEM and the reading means READ are cascade connected between the incoming data input ID and an outgoing interleaved data output OID of the interleaver INTERLEAVER. An output of the controller CTRL and a control input CI of the address generator ADDRESS are interconnected and two outputs of the address generator ADDRESS are coupled to address input AI1 of the writing means WRITE and AI2 of the reading means READ respectively.

The incoming data bytes are applied to the interleaver INTERLEAVER via its incoming data input ID are written in tail memory cells of the queues of the interleaving matrix MAT. Simultaneously, outgoing data bytes are read out of head memory cells of the queues of the matrix MAT by the reading means READ and applied to the outgoing data output OID of the interleaver INTERLEAVER. In which queue the writing means WRITE has to store incoming data bytes and from which memory cells the reading means READ has to read outgoing data bytes is defined by the addresses generated by the address generator ADDRESS. Indeed, address generator ADDRESS generates a first sequence of row ordinates or write addresses indicating to which tows of the interleaving matrix MAT subsequent incoming data bytes are to be applied and a second sequence of row ordinates or read addresses indicating from which rows of the interleaving matrix MAT subsequent outgoing data symbols are to be read. How both sequences look like depends upon the state wherein the address generator ADDRESS is set by the controller CTRL. The following paragraphs briefly describe three states wherein the address generator ADDRESS can be set.

If the address generator ADDRESS is set in a steady state, subsequent incoming data bytes are applied to subsequent rows of the matrix MAT in a circular way. With reference to FIG. 2, this means that a first incoming data byte is applied to Fifo0, a second is applied to Fifo1, a third is applied to Fifo2, a fourth is applied to Fifo3, a fifth is applied to Fifo4, a sixth is again applied to Fifo0 and so on. Subsequent outgoing data bytes are, still during this steady state, read from subsequent rows of the matrix MAT in a circular way. This is realizes for instance if the incoming and outgoing rates are equal and a byte is read from each row wherein a byte is written. Since the rows have different lengths, subsequently read data bytes were not subsequently written in the matrix MAT.

If the address generator ADDRESS is set in a transition state during which the interleaving depth is decreased, the number of data bytes read from each row of the matrix MAST is positively linearly related to the ordinate of that row. At the end of this transition state, the increment parameter M is decreased and also the average interleaving delay (the time between entering and leaving the interleaver INTERLEAVER for a single data byte) is decreased.

If the address generator ADDRESS is set in a transition state during which the interleaving depth is increased, the number of data bytes read from each row of the matrix MAT is negatively linearly related to the ordinate of that row. At the end of this transition state, the increment parameter M is increased and also the average interleaving delay is increased.

Summarizing, the sequence of reading data bytes from the interleaver INTERLEAVER differs in different states. More details concerning this will be given later. First, the structure of the de-interleaver DE-INTERLEAVER drawn in FIG. 3 is described.

Figure 3:
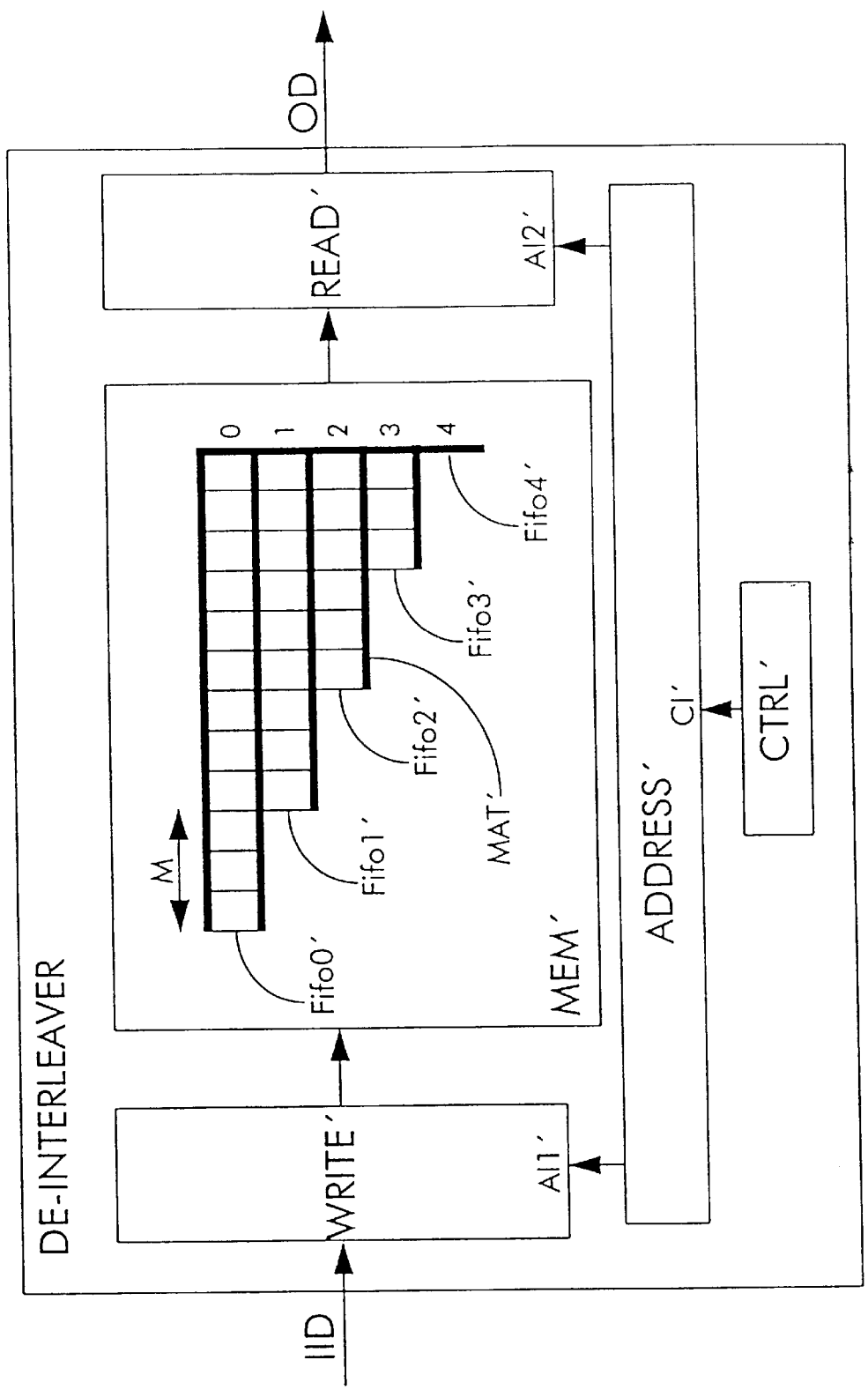
FIG. 3 is a block scheme of an embodiment of the de-interleaving device DE-INTERLEAVER according to the present invention.

The de-interleaver DE-INTERLEAVER of FIG. 3 includes writing means WRITE', reading means READ', a memory MEM', an address generator ADDRESS' and a controller CTRL'. The memory MEM' is equipped with a triangular shaped matrix MAT' of memory cells wherein each row is constituted by a first-in-first-out queue of memory cells. In FIG. 3, five rows of the matrix MAT' with respective ordinates 0, 1, 2, 3 and 4 are constituted by the queues Fifo0', Fifo1', Fifo2', Fifo3' and Fifo4' which have a decrementally shrinking length, the decrement per row being M=3.

The writing means WRITE', the memory means MEM', and the reading means READ' are cascade connected between the incoming interleaved data input IID and the outgoing data output OD of the de-interleaver DE-INTERLEAVER. An output of the controller CTRL' and a control input CI' of the address generator ADDRESS' are interconnected and two outputs of the address generator ADDRESS' are coupled to address inputs AI1' of the writing means WRITE' and AI2' of the reading means READ' respectively.

The incoming interleaved data bytes applied to the de-interleaver DE-INTERLEAVER via its incoming interleaved data input IID are written in tail memory cells of the queues of the de-interleaving matrix MAT'. Meanwhile, outgoing data bytes are read out of head memory cells of the queues of the matrix MAT' by the reading means READ' and applied to the outgoing data output OD of the de-interleaver DE-INTERLEAVER. In which memory cells the writing means WRITE' has to write data bytes and from which memory cells the reading means READ' has to deduce data bytes is defined by the addresses generated by the address generator ADDRESS'. This address generator ADDRESS' generates a first sequence of row ordinates or write addresses indicating to which rows of the interleaving matrix MAT' subsequent incoming interleaved data bytes are to be applied, and a second sequence of row ordinates or read address indicating from which rows of the interleaving matrix MAT' subsequent outgoing data bytes are to be read. How both sequences look like depends upon the state wherein the address generator ADDRESS' is set by the controller CTRL'. The following paragraphs again briefly describe three states wherein the address generator ADDRESS' can be set.

If the address generator ADDRESS' is set in a stead state, subsequent incoming interleaved data bytes are applied to subsequent rows of the matrix MAT', and subsequent outgoing data bytes are read from subsequent rows of the matrix MAT' in a circular way. Thus, each time an incoming byte is written in the head memory cell of a queue, an outgoing byte is read from this queue. Since the sum of the length of a queue in the interleaver INTERLEAVER of FIG. 2 and the length of the corresponding queue in the de-interleaver DE-INTERLEAVER of FIG. 3 is constant, the global interleaving/de-interleaving delay is the same for all bytes.

If the address generator ADDRESS' is set in a transition state during which the interleave depth is decreased, the number of data bytes written in each row of the matrix MAT' is positively linearly related to the ordinate of that row. At the end of this transition state, the decrement parameter M is decreased and also the aver de-interleaving delay (the time between entering and leaving the de-interleaver DE-INTERLEAVER) is decreased.

If the address generator ADDRESS' is set in a transition state during which the interleave depth is increased, the number of data bytes written in each row of the matrix MAT' is negatively linearly related to the ordinate of that row. At the end of this transition state, the decrement parameter M is increased and also the average de-interleaving delay is increased.

Summarizing, the sequence of writing data bytes in the de-interleaver DE-INTERLEAVER differs for different states. More details concerning this are given in the next paragraphs.

Figure 5A:
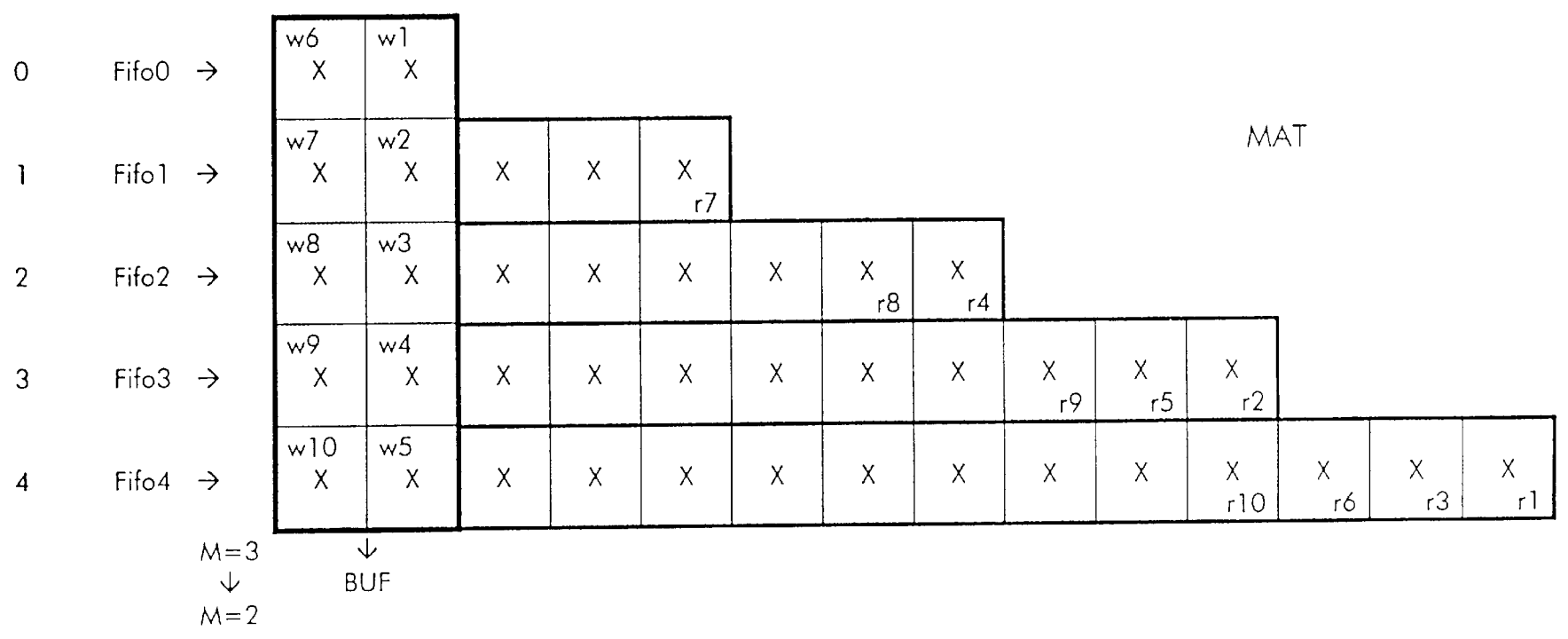
Figure 5B:
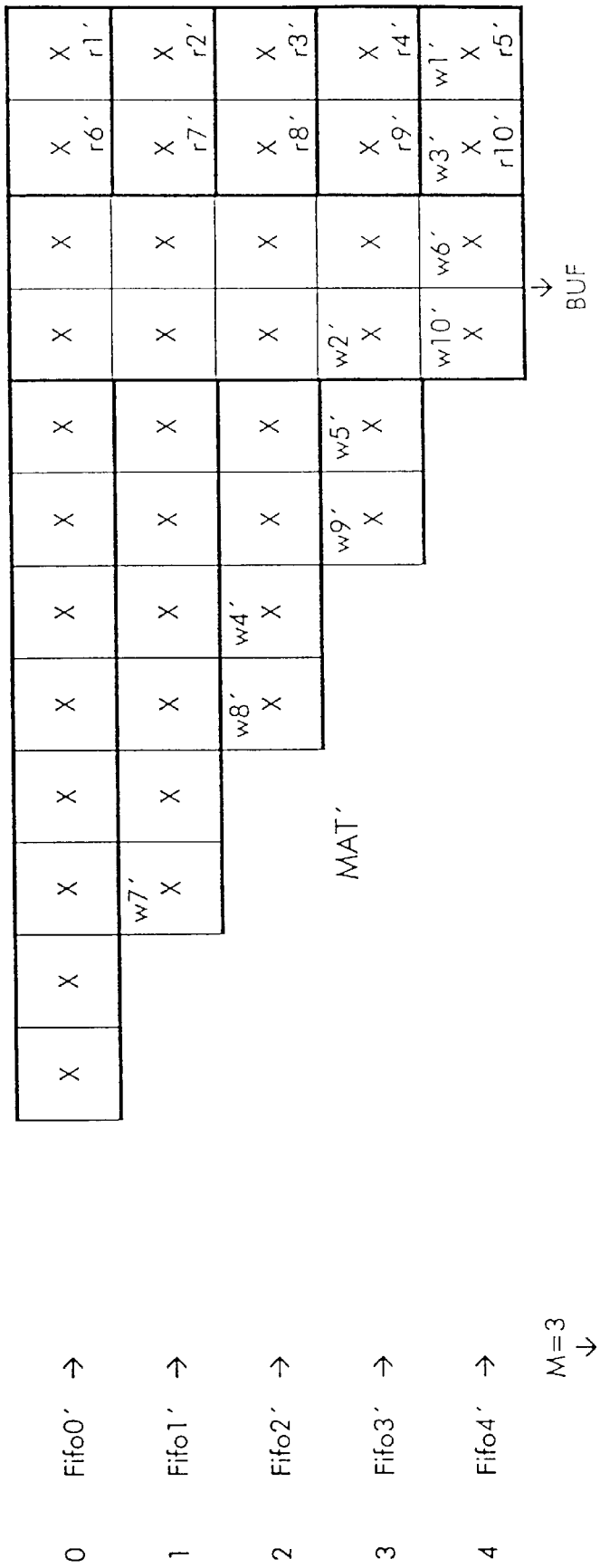
FIG. 5B is a drawing illustrating the filling of the de-interleaving memory with data bytes during this transition state wherein the delay increment M is reduced from 3 to 2.
Figure 6A:
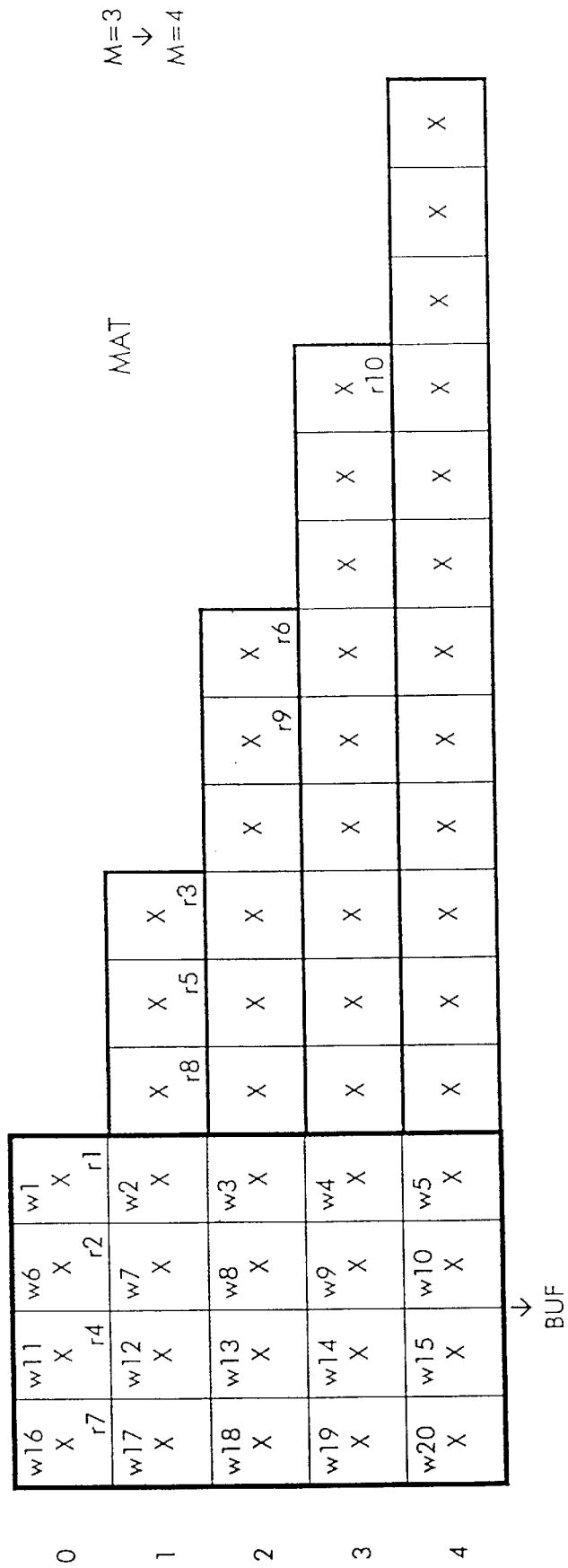
FIG. 6A is a drawing illustrating the filling of the interleaving memory with data bytes during a transition state wherein the delay increment M is in creased from 3 to 4.
Figure 6B:
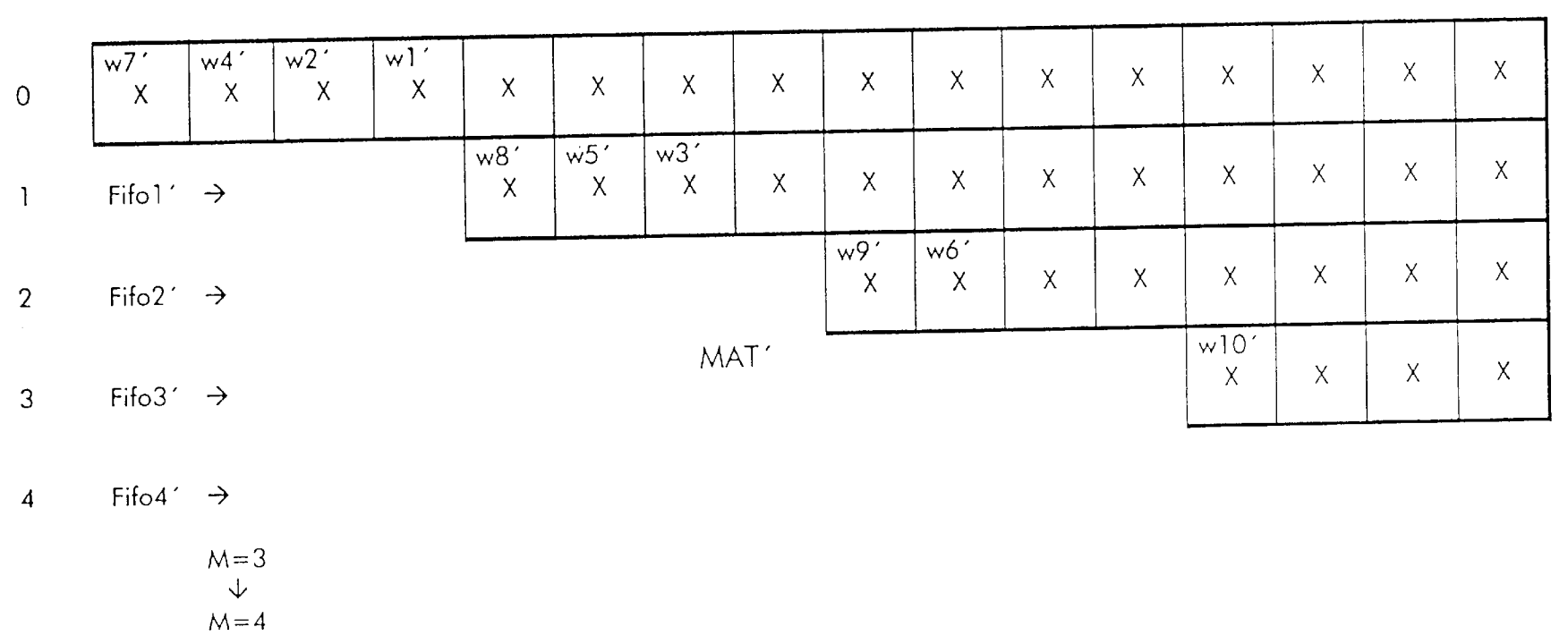

The filling of the interleaving and de-interleaving matrices MAT and MAT' in the above defined states will be described more detailed now. First, referring to FIG. 4A and FIG. 4B, the filling of the matrices MAT and MAT' will be descried when the address generators, ADDRESS and ADDRESS', operate in the steady state wherein the delay increment parameter M equals 3. Secondly, it is assumed that the address generators, ADDRESS and ADDRESS', are brought into the transition state wherein the delay increment parameter M is reduced from 3 to 2. Reference will be made to FIG. 5A and FIG. 5B when explaining the filling of MAT and MAT' in this state. In a last paragraph, the address generators, ADDRESS and ADDRESS', are set in the transition state wherein the delay increment parameter M is increased from 3 to 4. The filling of MAT and MAT' during this last state is described by referring to FIG. 6A and FIG. 6B.

In FIG. 4A, the matrix MAT is shown. Each row of this matrix MAT is constituted by a first-in-first-out memory, with tail memory cell at the leftmost side and head memory cell at the rightmost side. If a byte is applied to a row of matrix MAT, it is thus stored in the tail memory cell. Before writing this byte in the tail memory cell however, the byte contained by the head memory cell is read and all bytes in the first-in-first-out memory are shifted one position towards the head memory cell. Such a first-in-first-out memory may be realized in hardware (e.g. a shift register) or software (by adapting the tail and head memory cell pointers with a program each time a byte is written or read). The write-to-read delay experienced by a byte applied to a row of the matrix MAT is proportional to the length of the first-in-first-out memory constituting that row. The matrix drawn in FIG. 4A contains 5 rows with ordinates 0, 1, 2, 3 and 4 and first-in-first-out memories Fifo0, Fifo1, Fifo2, Fifo3 and Fifo4. The delay experienced by a byte in MAT is equal to j.M.I. Herein, j represent the ordinate of the row, M represents the delay increment per row, and I represents the number of rows in the matrix MAT.

Figure 4B:
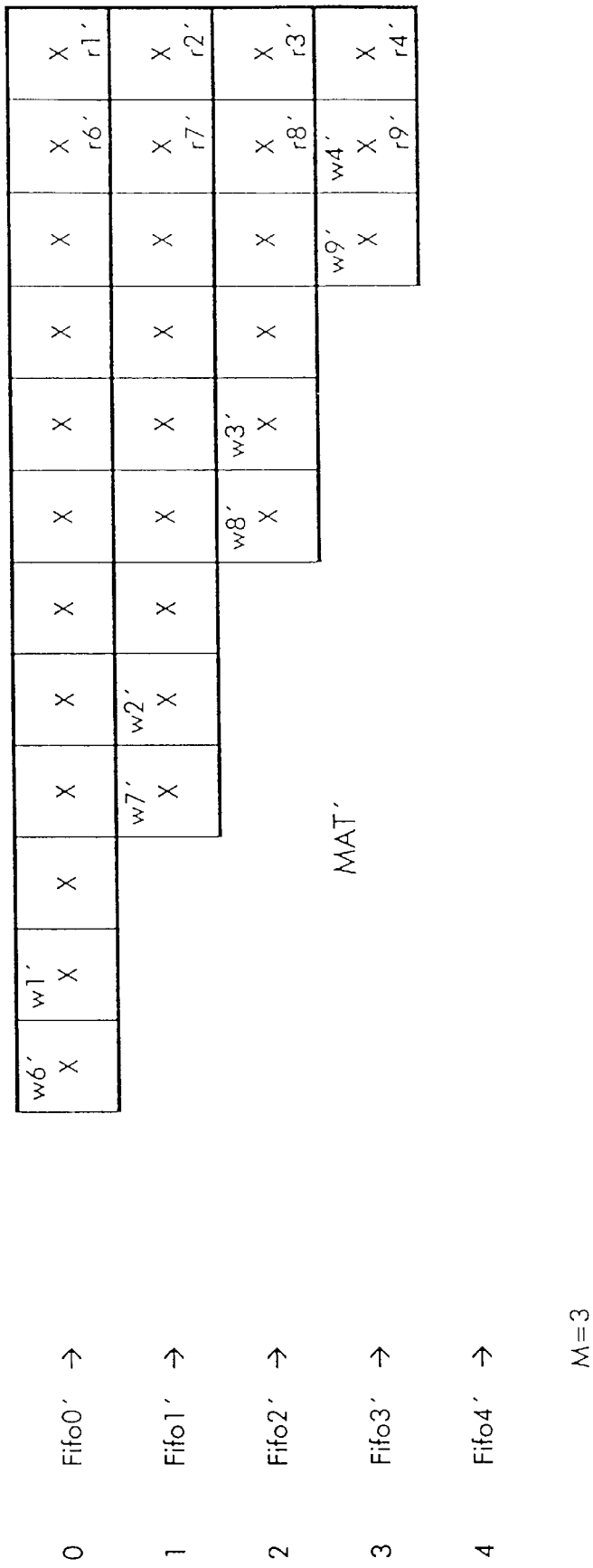
FIG. 4B is a drawing illustrating the filling of the de-interleaving memory with data bytes during the stead state wherein the delay increment M is 3.

The de-interleaving matrix MAT' of FIG. 4B is similar to the interleaving matrix MAT of FIG. 4A but the row ordinates are reversed so that row ordinates corresponding to shirt first-in-first-out memories in the interleaving matrix MAT, correspond to long first-in-first-out memories in the de-interleaving matrix MAT'.

When a byte is applied to a row, for instance row 2, in the interleaver INTERLEAVER, it is stored in the tail memory cell of Fifo2 after a byte is read from the head memory cell of Fifo2 to be transmitted over the transmission line TL of FIG. 1. Upon receipt by the de-interleaver DE-INTERLEAVER, this byte is stored in the tail memory cell of Fifo2' after a byte is read from the head memory cell of Fifo2'. Since the sum of the write-to-read delay of a row of the interleaver INTERLEAVER and that of the corresponding row of the de-interleaver DE-INTERLEAVER is constant, each byte experiences the same global delay. Subsequent incoming bytes are written in subsequent rows of the matrix MAT. The first byte experiences no interleaving delay and is immediately transmitted to the receiver. Fifo0 therefore is an empty queue in FIG. 4A. The second byte is written in Fifo1 which is indicated by w2 in FIG. 4A. The third byte, fourth byte and fifth byte are applied to Fifo2, Fifo3 and Fifo4 respectively and fill the memory cells marked by w3, w4 and w5. The sixth byte again passes through Fifo0 and experiences no interleaving delay and bytes 7, 8, 9 and 10 are subsequently stored in the new tail memory cells of Fifo1, Fifo2, Fifo3 and Fifo4 marked by w7, w8, w9 and w10 respectively. While writing bytes in the tail memory cells of the queues, bytes are read from the head memory cells. Hence the first byte is transmitted without interleaving delay, and is followed by bytes r2, r3, r4, r5 read from Fifo1, Fifo2, Fifo3 and Fifo4 respectively. Then, again a byte is transmitted without interleaving delay and this one is followed by bytes r7, r8, r9 and r10. The indexes used in FIG. 4B with prefixes w and r in a similar way indicate how the interleaved incoming stream of bytes is stored in the de-intleaving matrix MAT'and read therefrom to constitute the non-interleaved output data stream. In FIG. 4B, Fifo4' is an empty queue which indicates that bytes applied to this row experience no de-interleaving delay.

During the stead state of the system, the different bitrates at inputs and outputs of the interleaver and de-interleaver are supposed to be equal. The interleaving depth D is equal to I*M+1. Herein, I again represents the number of rows in the interleaving matrix MAT.

As shown in FIG. 5A, the transition state wherein M is decreased from 3 to 2 is entered by writing a byte w1 in a memory cell of Fifo0. Instead of reading a byte from Fifo0, a byte r1 is read now from Fifo4 now. The next bytes to be transmitted are read from:

Fifo3 (r2) and Fifo4 (r3);

Fifo2 (r4), Fifo3 (r5) and Fifo4 (r6);

Fifo1 (r7), Fifo2 (r8), Fifo3 (r9) and Fifo4 (r10).

Meanwhile, the bytes w2 to w10 are written in the memory of the interleaver. The bytes that are read from the matrix MAT in the interleaver are transmitted towards the receiver and stored in the de-interleaver in corresponding rows of the matrix MAT". The bytes r1 to r10 of FIG. 5A thus represent bytes w1' to w10' in FIG. 5B. Similarly, bytes r1' to r10' are read from the matrix MAT" to constitute the de-interleaved output data stream that is applied to the decoder of FIG. 1. The bytes that are written and read during the transition state are shaded grey in FIG. 5A and FIG. 5B. The unshaded cells contain only an "X". At the end of the transition state, a buffer BUF of size I.(I−1)/2 is present in both the interleaver (see FIG. 5A) and de-interleaver (see FIG. 5B). to obtain an interleaver with delay increment parameter M=2, these 2 buffers BUF have to be emptied. The memory requirement for performing the transition from M=3 to M=2 is thus I(I−1)/2 bytes in the interleaver and in the de-interleaver. This memory may be provided by an enlarged capacity of the first-in-first-out queues of the matrices MAT and MAT', or can be implemented by a normal memory without a first-in-first-out structure.

It is to be remarked that instead of transmitting only useful bytes over the transmission line TL, dummy bytes can be inserted in the transmitted data stream. Such dummy bytes are no de-interleaved. An alterative transmission sequence for the one described above is as follows:

- 4 dummy bytes are transmitted, byte r1 from Fifo4 is transmitted;
- 3 dummy bytes are transmitted, bytes r2 and r3 from Fifo3 and Fifo4 are transmitted,
- 2 dummy bytes are transmitted, bytes r4, r5 and r6 from Fifo2, Fifo3 and Fifo4 are transmitted;
- 1 dummy byte is transmitted, bytes r7, r8, r9 and r10 from Fifo1, Fifo2, Fifo3 and Fifo4 are transmitted.

Compared to the above version of the transition state, the latter implementation has the drawback of using part of the bandwidth on the transmission line TL for transmission of dummy bytes but has the advantage of not losing immunity during the modification of M. The latter implementation moreover requires no buffer BUF in the de-interleaver but the size of the interleaver buffer has doubled.

If the transmit rate for transmission over the line TL increases, the interleave depth D also has to increase to keep constant impulse noise immunity. This can again be realized by manipulating M and the structure of the matrices MAT and MAT'. The following paragraphs will clarify how M can be increased from 3 to 4 during the transition state illustrated by FIG. 6A and FIG. 6B. Again, the cells with "X" only are unshaded.

The transition phase to increase M from 3 to 4 is initiated by filling a buffer BUF of I.(I−1) bytes in the interleaver. Afterwards, following sequence of bytes is transmitted:

- a byte (r1) from Fifo0;
- a byte (r2) from Fifo0 and a byte (r3) from Fifo1;
- a byte (r4) from Fifo0, a byte (r5) from Fifo1 and a byte (r6) from Fifo2;
- a byte (r7) from Fifo0, a byte (r8) from Fifo1, a byte (r9) from Fifo2 and a byte (r10) from Fifo3.

During this transition state, bytes transmitted over the transmission line TL are written in the corresponding rows of the de-interleaver memory but no bytes are read from the de-interleaver memory. The de-interleaver and interleaver return to the stead state with delay increment M=4 after the transition state. In the interleaver memory, a buffer BUF of I.(I−1)/2 memory cells contains bytes now. To obtain an interleaver with delay increment M=4, this buffer BUF has to be emptied. The memory requirement for performing the transition from M=3 to M=4 is I.(I−1) bytes in the interleaver. This may again be provided by an enlarged capacity of the first-in-first-out memories Fifo0, Fifo1, Fifo2, Fifo3 and Fifo4 of the matrix MAT, or the buffer BUF can be implemented by a normal memory without first-in-first-out structure.

It is to be remarked that instead of transmitting only useful bytes over the transmission line TL, one can again think of an alternative implementation wherein dummy bytes are transmitted. The sequence for transmitting bytes may then be as follows:

- a byte (r1) from Fifo0 followed by 4 dummy bytes;
- a byte (r2) from Fifo0 and a byte (r2) from Fifo1 followed by 3 dummy bytes;
- a byte (r4) from Fifo0, a byte (r5) from Fifo1 and a byte (r6) from Fifo2 followed by 2 dummy bytes; and
- a byte (r7) from Fifo0, a byte (r8) from Fifo1, a byte (r9) from Fifo2 and a byte (r10) from Fifo3, followed by a dummy byte.

Compared to the first version, the latter implementation of the transition state again has the drawback of using part of the bandwidth on the transmission line TL for transmission of dummy bytes but has the advantage of not losing immunity during the modification of M. The latter implementation moreover requires no buffer in the interleaver, and the address generator may be less complex.

It is to be noted that the applicability of the present invention is not restricted by the transmission medium of the transmission line TL. In particular, any connection between the transmitter TX and receiver RX, e.g. a cable connection, a telephone line, a satellite connection, an optical fibre, a radio link through the air, and so on may be affected by burst noise and an thus be protected by a method according to the present invention.

The present invention is very suitable for being used in the various types of Digital Subscriber Line (DSL) modems, such as VDSL (Very High Speed Digital Subscriber Line) modems ADSL (Asymmetric DSL), etc., sometimes generally called xDSL, or the like. These modems will transport digital data at high bitrates over telephone lines. The telephone lines may be affected by several sources of burst noise, especially when the lines are stretched through the air. Radio interference from radio amateurs, critical weather conditions, transient appearances due to ringing and hooking are a few of the noise sources affecting transmission over such telephone lines. Although the present invention is an attractive solution for providing transmit rate independent impulse noise immunity in such VDSL systems, the applicability of the present invention is not limited to these systems or to similar systems having the same type of modulation and/or encoding. As will be recognized by a person skilled in the art, the modulation constellation and encoding scheme used by the modulator and the encoder respectively are of no importance for the present invention.

It is further remarked that the transmitter TX and receiver RX according to the present invention may be integrated in a single transceiver. This is so in modems which are adapted to transmit and receive data to and from a bi-directional transmission line. In case the transmitter and receiver are integrated, the triangular interleaving and de-interleaving matrixes, MAT and MAT', may be grouped to constitute a rectangular interleaving/de-interleaving matrix. Obviously, also the functionality of both writing means, WRITE and WRITE', both reading means, READ and READ', both addressing means, ADDRESS and ADDRESS', and both controllers, CTRL and CTRL', may be combined and integrated in one writing unit, one reading unit, one addressing unit and one control unit respectively.

Furthermore it is noticed that via the present invention, the delay increment parameter M may be increased or decreased by more than one unit. As well for the decreasing as for the increasing process, it suffices to execute the above described transition states more than once.

While the principles of the invention have been described above in connection with specific apparatus, it is to be clearly understood that this description is made only by way of example and not as a limitation on the scope of the invention.

What is claimed is:

1. Method for interleaving incoming data bytes (w1, . . . , w10) of an incoming data stream (ID) to thereby generate an outgoing interleaved data stream (OID) of outgoing interleaved data bytes (r1, . . . r10), characterized by writing said incoming data bytes (w1, ..., w10) in tail memory cells of rows of a triangular shaped matrix (MAT) of memory cells, each row of memory cells in said matrix (MAT) representing a first-in-first-out queue (Fifo0, Fifo1, Fifo2, Fifo3, Fifo4), and reading said outgoing interleaved data bytes (r1, ..., r10) from head memory cells of said rows thereby reading said outgoing itnerleaved data stream (OID), characterized by reading from each row an amount of said outgoing interleaved data bytes (r1, ..., r10) which is linearly related to an ordinate number (0, 1, 2, 3, 4) of said row in said triangular shaped matrix (MAT).

2. Method for interleaving according to claim 1, characterized in that meanwhile writing in each row of said triangular shaped matrix (MAT) an equal amount of said incoming data bytes (w1, ..., 210).

3. Method for interleaving according to claim 1, further characterized by reading said outgoing interleaved data bytes (r1, ..., r10) when the transmit rate for transmission of said outgoing interleaved data stream (OID) over a transmission line (TL) increases or decreases.

4. Method for interleaving according to claim 3, characterized in that when said transmit ate remains substantially constant, writing an equal amount of said incoming data bytes (w1, ..., w10) in each row of said triangular shaped matrix (MAT) while reading an equal amount of said outgoing interleaved data bytes (r1, ..., r10) from each row.

5. Method for interleaving according to claim 3, characterized in that when said transmit rate decreases, reading said amount of said outgoing interleaved data bytes (r1, ..., r10) positively with respect to said ordinate number (0, 1, 2, 3, 4).

6. Method for interleaving according to claim 5, characterized in that when said transmit rate decreases, reading successive outgoing interleaved data byes (r1, ..., r10) from:

row l row l-1 and row l;

row l-2, row l-1 and row l;

until outgoing interleaved data bytes are read from row 1 to row l-1 wherein l is the number of rows in said triangular shaped matrix (MAT).

7. Method for interleaving according to claim 6, characterized by generating I-1 dummy bytes and inserting said I-1 dummy bytes in said outgoing interleaved data stream (OID) before reading a first outgoing interleaved data byte out of row I;

generating I-2 dummy bytes and inserting said I-2 dummy bytes in said outgoing interleaved data stream (OID) before reading a first outgoing interleaved data byte out of row I-1;

generating I-3 dummy bytes and inserting said I-3 dummy bytes in said outgoing interleaved data stream (OID) before reading a first outgoing interleaved data byte out of row I-2, wherein the number of dummy bytes is positively linearly related by one less than the ordinate number (0, 1, 2, 3, 4, I) of the row.

8. Method for interleaving according to claim 3, characterized in that when said transmit rate increases, reading said amount of said outgoing interleaved data bytes (r1, ..., r10) negatively with respect to said ordinate number (0, 1, 2, 3, 4).

9. Method for interleaving according to claim 8, characterized in that when said transmit rate increases, reading successive outgoing interleaved data bytes (r1, ..., r10) from:

row 0 row 0 and row 1;

row 0, row 1 and row 2, until outgoing interleaved data bytes are read from row 9 to row l-2, wherein l is the number of rows in said triangular shaped matrix (MAT).

10. Method for interleaving according to claim 9, characterized by generating I-1 dummy bytes and inserting said I-1 dummy bytes in said outgoing interleaved data stream (OID) after reading a first outgoing interleaved data byte out of row 0;

generating I-2 dummy bytes and inserting said I-2 dummy bytes in said outgoing interleaved data stream (OID) after reading a first outgoing interleaved data byte out of row 1;

generating I-3 dummy bytes and inserting said I-3 dummy bytes in said outgoing interleaved data stream (OID) after reading a first outgoing interleaved data byte out of row 2, until dummy bytes are read from row 0 to row I-2, wherein I is the number of rows in said triangular shaped matrix (MAT).

11. Method for de-interleaving incoming interleaved data bytes (w1', ..., w10') of an incoming interleaved data stream (IID) to thereby generate an outgoing data stream (OD) of outgoing data bytes (r1', ..., r10'), characterized by writing said incoming interleaved data bytes (w1', ..., w10') in tail memory cells of rows of a triangular shaped matrix (MAT') of memory cells, each row of memory cells in said matrix (MAT') representing a first-in-first-out queue (Fifo0', Fifo1', Fifo2', Fifo3', Fifo4'), and reading said outgoing data bytes (r1', ..., r10') from head memory cells of said rows thereby realizing said outgoing data stream (OD), characterized by writing in each row of said triangular shaped matrix (MAT') an amount of said incoming interleaved data bytes (w1', ..., w10') which is linearly related to a ordinate number (0, 1, 2, 3, 4) of said row in said triangular shaped matrix (MAT').

12. Interleaving device (INTERLEAVER) used to re-sequence incoming data bytes (w1, ..., w10) of an incoming data stream (ID) to thereby generate an outgoing interleaved data stream (OID) of outgoing interleaved data bytes (r1, ..., r10), said interleaving device (INTERLEAVER) comprising:

a. memory means (MEM) including a plurality of first-in-first-out queues (Fifo0, Fifo1, Fifo2, Fifo3, Fifo4) adapted to represent respective rows of a triangular shaped matrix (MAT) of memory cells;

b. writing means (WRITE) with an output coupled to an input of said memory means (MEM), said writing means (WRITE) being adapted to write each one of said incoming data bytes (w1, ..., w10) in a tail memory cell of one of said rows identified by a write address;

c. reading means (READ) with an input coupled to an output of said memory means (MEM), said reading means (READ) being adapted to read each one of said outgoing interleaved data bytes (r1, ..., r10) from a head memory cell of one of said rows identified by a read address; and d. address generating means (ADDRESS), a first output of which is coupled to an address input (AI1) of said writing means (WRITE) and a second output of which is coupled to an address input (AI2) of said reading means (READ), said address generating means (ADDRESS) being adapted to generate said write address and said read address, characterized in that said address generating means (ADDRESS) is further adapted to generate for each row an amount of read addresses which is linearly related to an ordinate number (0, 1, 2, 3, 4) of said row in said triangular shaped matrix (MAT).

13. Interleaving device (INTERLEAVER) according to claim 12, characterized in that said interleaving device (INTERLEAVER) further includes:

e. control means (CTRL), an output of which is coupled to a control input (CI) of said address generating means (ADDRESS), said control means (CTRL) being adapted to bring said address generating means (ADDRESS) either in a stead state or a transition state; and further in that f. said address generating means (ADDRESS) is adapted to generate said read addresses in this way in said transition state, and is adapted to generate, in said steady state, for each row of said triangular shaped matrix (MAT) an equal amount of read addresses, and meanwhile to generate for each row an equal amount of write addresses.

14. Interleaving device (INTERLEAVER) according to claim 12, characterized in that said memory means (MEM) further is provided with:

g. a buffer of at most I*(I–1) memory cells, I being the number of rows in said triangular shaped matrix (MAT), said buffer being adapted to temporarily store part of said incoming data bytes (w1, . . . , w10).

15. De-interleaving device (DE-INTERLEAVER) used to re-sequence incoming interleaved data bytes (w1', . . . w10') of an incoming interleaved data stream (IID) to thereby generate an outgoing data stream (OD) of outgoing data bytes (r1', . . . , r10'), said de-interleaving device (DE-INTERLEAVER) comprising:

a. memory means (MEM') including a plurality of first-in-first-out queues (Fifo0', Fifo1', Fifo2', Fifo3', Fifo4') adapted to represent respective rows of a triangular shaped matrix (MAT') of memory cells;

b. writing means (WRITE') with an output coupled to an input of said memory means (MEM'), said writing means (WRITE') being adapted to write each one of said incoming interleaved data bytes (w1', . . . , w10') in a tail memory cell of one of said rows identified by a write address;

c. reading means (READ') with an input coupled to an output of said memory means (MEM'), said reading means (READ') being adapted to read each one of said outgoing data bytes (r1', . . . , r10') from a head memory cell of one of said rows identified by a read address; and d. address generating means (ADDRESS'), a first output of which is coupled to an address input (AI1') of said writing means (WRITE') and a second output of which is coupled to an address input (AI2') of said reading means (READ'), said address generating means (ADDRESS') being adapted to generate said write address and said read address, characterized in that said address generating means (ADDRESS') further is adapted to generate for each row of said triangular shaped matrix (MAT') an amount of write addresses which is linearly related to an ordinate number (0, 1, 2, 3, 4) of said row in said triangular shaped matrix (MAT').

16. De-interleaving device (DE-INTERLEAVER) according to claim 15, characterized in that said de-interleaving device (DE-INTERLEAVER) further includes:

e. control means (CTRL'), an output of which is coupled to a control input (CI') of said address generating means (ADDRESS'), said control means (CTRL') being adapted to bring said address generating means (ADDRESS') either in a stead state or a transition state; and further in that f. said address generating means (ADDRESS') is adapted to generate said write address in this way in said transition state, and is adapted to generate, in said steady state, for each row of said triagnular shaped matrix (MAT') an equal amount of read address, and meanwhile to generate for each row an equal amount of write addresses.

17. De-interleaving device (DE-INTERLEAVER) according to claim 15, characterized in that said memory means (MEM') further is provided with:

g. a buffer of at most I*(I–1)/2 memory cells, I being the number of rows in said triangular shaped matrix (MAT'), said buffer being adapted to temporarily store part of said incoming interleaved data bytes (w1', . . . , w10').

18. A communication system comprising a transmitter (TX) coupled via a transmission line (TL) to a receiver (RX), said transmitter (TX) comprising the cascade connection of:

a. a data source (DATA SOURCE) provided to generate a data stream;

b. encoding means (ENCODER) provided to extend words of said data stream with redundant information to thereby generate codewords of an incoming data stream (ID);

c. interleaving means (INTERLEAVER) provided to re-sequence incoming data bytes (w1, . . . , w10) of said incoming data stream (ID) to thereby generate an outgoing interleaved data stream (OID) of outgoing interleaved data bytes (r1, . . . , r10); and d. modulating means (MOD) provided to modulate said outgoing interleaved data stream (OID) on at least one data carrier to be transmitted over said transmission line (TL), said interleaving means (INTERLEAVER) comprising:

c1. first memory means (MEM) including a plurality of first-in-first-out queues (Fifo0, Fifo1, Fifo2, Fifo3, Fifo4) adapted to represent respective rows of a first triangular shaped matrix (MAT) of memory cells;

c2. first writing means (WRITE) with an output coupled to an input of said first memory means (MEM), said first writing means (WRITE) being adapted to write each one of said incoming data bytes (w1, . . . , w10) in a tail memory cell of one of said rows identified by a write address;

c3. first reading means (READ) with an input coupled to an output of said first memory means (MEM), said reading means (READ) being adapted to read each one of said outgoing interleaved data bytes (r1, . . . , r10) from a head memory cell of one of said rows identified by a read address; and c4. first address generating means (ADDRESS), a first output of which is coupled to an address input (AI1) of said first writing means (WRITE) and a second output of which is coupled to an address input (AI2)

of said first reading means (READ), said first address generating means (ADDRESS) being adapted to generate said write address and said read address, and said receiver (RX) comprising the cascade connection of:

e. de-modulating means (DMOD) provided to de-modulate incoming interleaved data bytes (w1', ..., w10') from said at least one carrier to thereby produce an incoming interleaved data stream (IID);

f. de-interleaving means (DE-INTERLEAVER) provided to re-sequence said incoming interleaved data bytes (w1', ..., w10') in said incoming interleaved data stream (IID) to thereby generate an outgoing data stream (OD) of outgoing data bytes (r1', ..., r10') grouped in codewords;

g. decoding means (DECODER) provided to detect and correct errors in said codewords by interpretation of redundant information therein to thereby produce a data stream of words; and h. a data sink (DATA SINK) provided to receive said data stream from said decoding means (DECODER), said de-interleaving means (DE-INTERLEAVER) comprising:

f1. second memory means (MEM') including a plurality of first-in-first-out queues (Fifo0', Fifo1', Fifo2', Fifo3', Fifo4') adapted to represent respective rows of a second triangular shaped matrix (MAT') of memory cells;

f2. second writing means (WRITE') with an output coupled to an input of said second memory means (MEM'), said second writing means (WRITE') being adapted to write each one of said incoming interleaved data bytes (w1', ..., w10') in a tail memory cell of one of said rows identified by a write address;

f3. second reading means (READ') with an input coupled to an output of said second memory means (MEM'), said reading means (READ') being adapted to read each one of said outgoing data bytes (r1', ..., r10') from a head memory cell of one of said rows identified by a read address; and f4. second address generating means (ADDRESS'), a first output of which is coupled to an address input (AI1') of said second writing means (WRITE') and a second output of which is coupled to an address input (AI2') of said second reading means (READ'), said second address generating means (ADDRESS') being adapted to generate said write address and said read address, characterized in that said first address generating means (ADDRESS) is further adapted to generate for each row an amount of read addresses which is linearly related to an ordinate number (0, 1, 2, 3, 4) of said row in said first triangular shaped matrix (MAT), and further in that said second address generating means (ADDRESS') further is adapted to generate for each row of said second triangular shaped matrix (MAT') an amount of write addresses which is linearly related to an ordinate number (0, 1, 2, 3, 4) of said row in said second triangular shaped matrix (MAT').

* * * * *

UNITED STATES PATENT AND TRADEMARK OFFICE
CERTIFICATE OF CORRECTION

PATENT NO.   : 6,151,690
DATED        : November 21, 2000
INVENTOR(S)  : Miguel Peeters Page 1 of 1

It is certified that error appears in the above-identified patent and that said Letters Patent is hereby corrected as shown below:

Column 14,
Line 67, cancel "(rl,...r10)," and substitute -- (rl, ..., r10), --.

Column 15,
Line 6, cancel "reading" and substitute -- realizing --.
Line 7, cancel "itnerleaved" and substitute -- interleaved --.
Line 22, cancel "ate" and substitute -- rate --.
Line 39, after "1-1", insert -- , --.
Line 47, cancel "I" and substitute -- 1 --.

Column 17,
Line 17, cancel "stead" and substitute -- steady --.
Line 34, cancel "(w1',...w10')" and substitute -- (w1', ..., w10') --.

Column 18,
Line 9, cancel "stead" and substitute -- steady --.
Line 12, cancel "address" and substitute -- addresses --.
Line 15, cancel "address" and substitute -- addresses --.

Signed and Sealed this

Twenty-first Day of August, 2001

*Attest:*

NICHOLAS P. GODICI

*Attesting Officer*     Acting Director of the United States Patent and Trademark Office